(12) United States Patent
Jean

(10) Patent No.: US 8,987,928 B2
(45) Date of Patent: Mar. 24, 2015

(54) LINEAR DUAL EAP GENERATOR

(75) Inventor: Philippe F. Jean, Nice (FR)

(73) Assignee: Single Bovy Moorings, Inc., Marly (CH)

( * ) Notice: Subject to any disclaimer, the term of this patent is extended or adjusted under 35 U.S.C. 154(b) by 395 days.

(21) Appl. No.: 13/310,465

(22) Filed: Dec. 2, 2011

(65) Prior Publication Data
US 2013/0140943 A1 Jun. 6, 2013

(51) Int. Cl.
*F03B 13/10* (2006.01)
(52) U.S. Cl.
USPC .............................. 290/42; 290/53; 310/339
(58) Field of Classification Search
CPC ............... F03G 7/08; F03G 3/06; H02N 2/18; B60L 11/005; B60L 8/00; H01H 33/34; Y02T 10/7022
See application file for complete search history.

(56) References Cited

U.S. PATENT DOCUMENTS

| | | | |
|---|---|---|---|
| 6,628,040 B2 * | 9/2003 | Pelrine et al. ................. 310/307 | |
| 6,768,246 B2 | 7/2004 | Pelrino et al. | |
| 6,812,624 B1 | 11/2004 | Pei et al. | |
| 7,038,357 B2 | 5/2006 | Goldenberg et al. | |
| 7,166,953 B2 | 1/2007 | Heim et al. | |
| 7,439,657 B2 * | 10/2008 | Clingman et al. ............ 310/339 |
| 7,508,085 B2 * | 3/2009 | Martineau ...................... 290/1 R |
| 7,632,041 B2 * | 12/2009 | Jean et al. ........................ 405/76 |
| 7,834,527 B2 * | 11/2010 | Alvarez Icaza Rivera et al. .............................. 310/344 |
| 8,120,195 B2 * | 2/2012 | Pollack et al. ................... 290/53 |
| 8,283,839 B2 * | 10/2012 | Heim ............................. 310/328 |
| 2001/0029401 A1 | 10/2001 | Ishida et al. | |
| 2010/0314871 A1 * | 12/2010 | Jean et al. ....................... 290/42 |
| 2011/0298215 A1 * | 12/2011 | Wille et al. ...................... 290/53 |

* cited by examiner

*Primary Examiner* — Michael Zarroli
(74) *Attorney, Agent, or Firm* — Lawrence S. Cohen

(57) ABSTRACT

Water movement in shallow waters is used to obtain electrical energy. Some systems use panels (4) that are pivotally mounted (13) near the sea floor in shallow water and that extend up to the sea surface, or that are pivotally mounted above the sea surface and extend down into the sea. Electricity is obtained by stretching and relaxing capacitor devices that each has a sheet (188) of elastomeric material and has electrodes (184, 186) at the sheet opposite faces. In one system, a pair of capacitor devices (180, 182) lie in a cylinder (152) that holds a piston head (160) and the cylinder or the piston head is attached to a float and the other is fixed on the sea floor. Upper and lower ends (190, 194, 197, 199) of the devices are mounted so when one capacitor device is stretched (180B) the other is relaxed (182B).

13 Claims, 16 Drawing Sheets

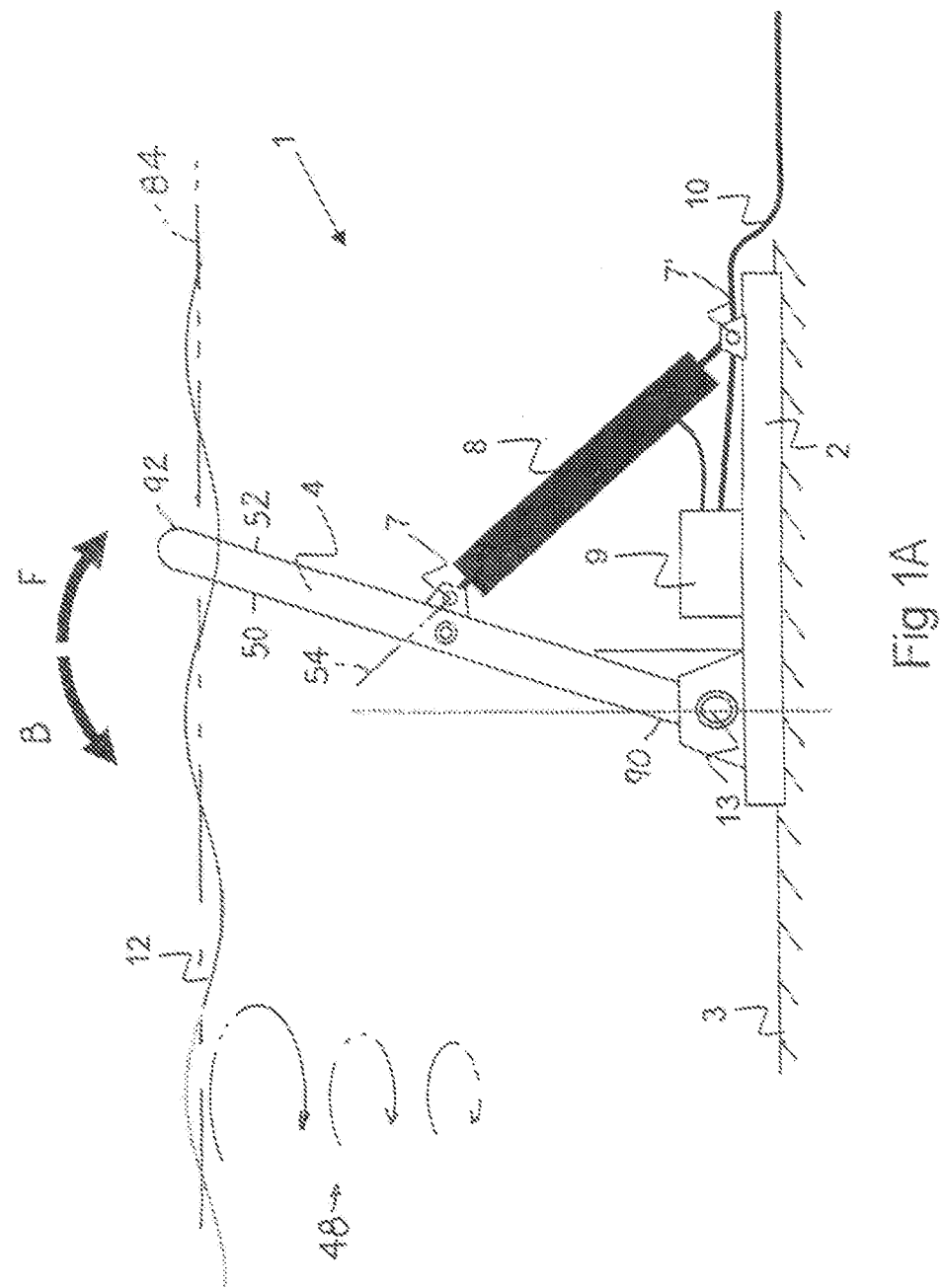

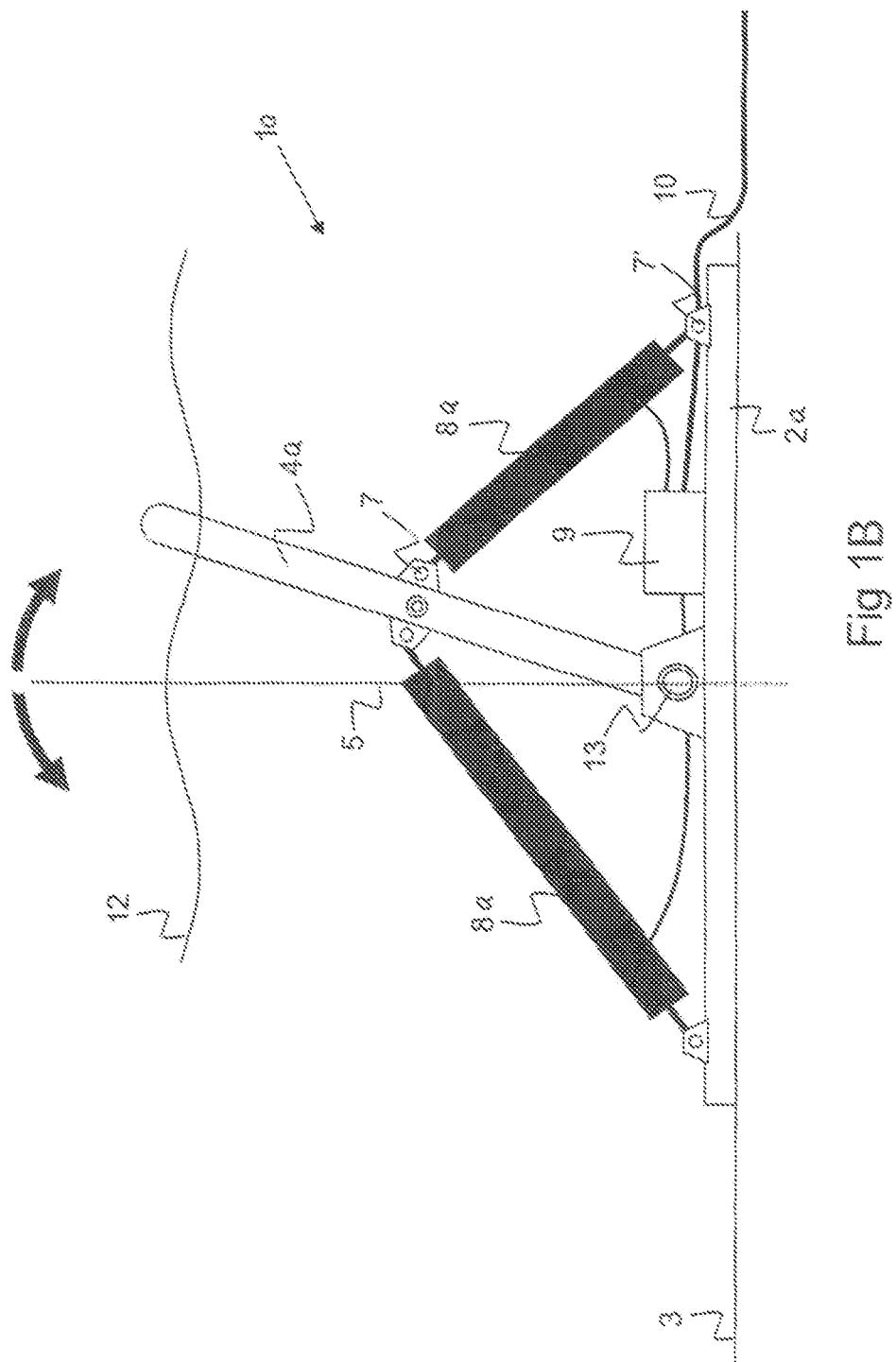

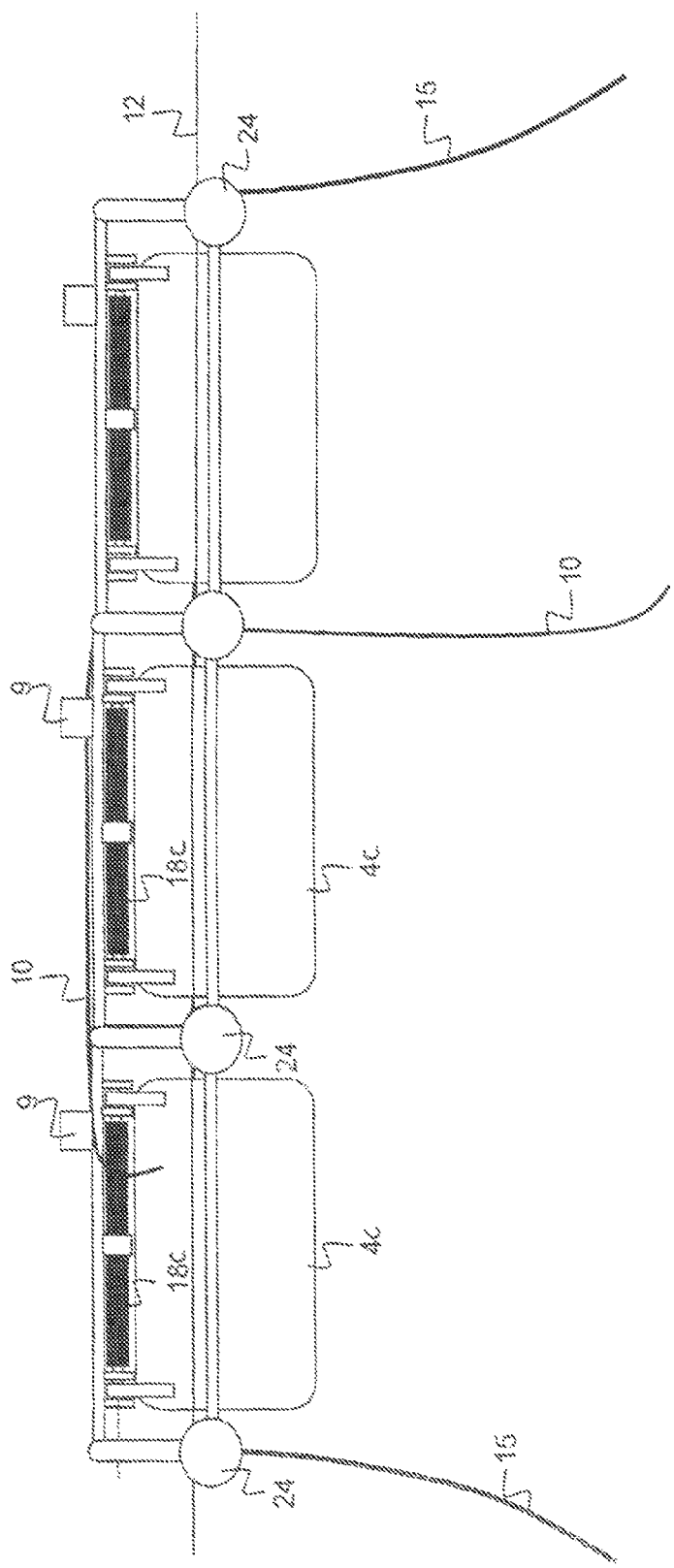

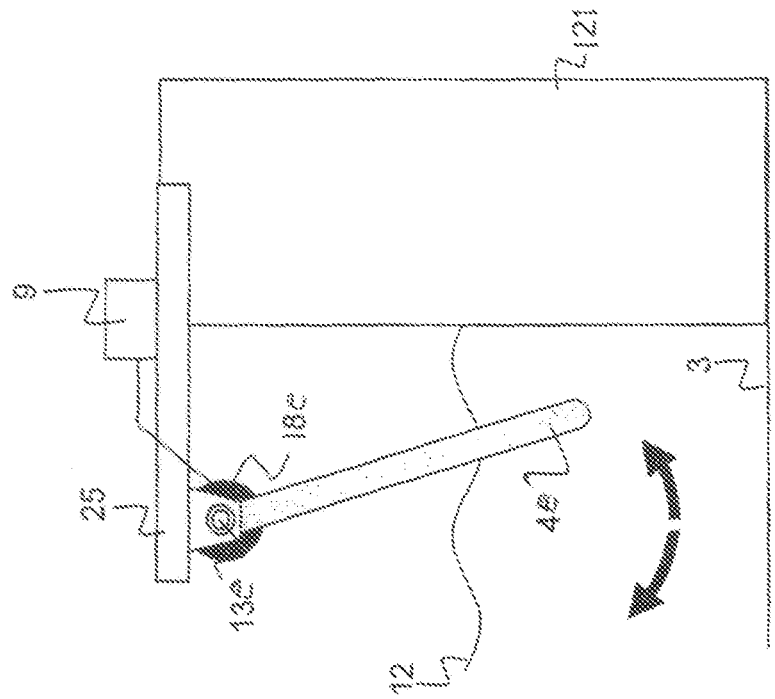
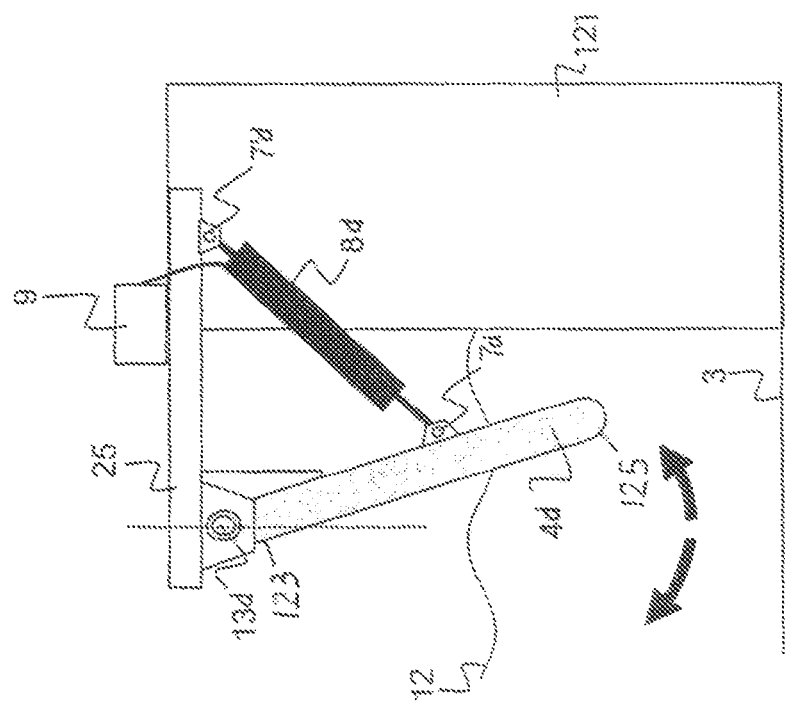

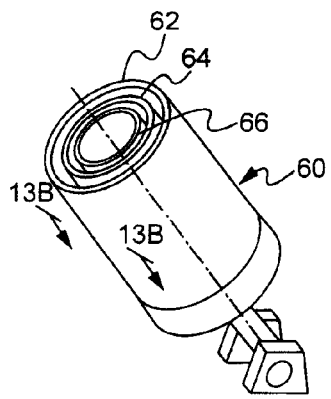
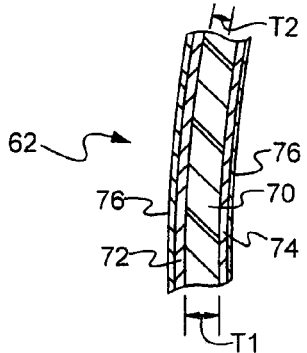
Fig. 13A  Fig. 13B
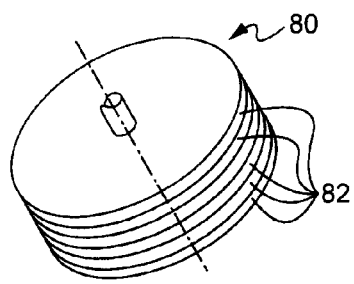
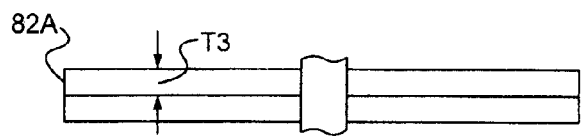
Fig. 14A
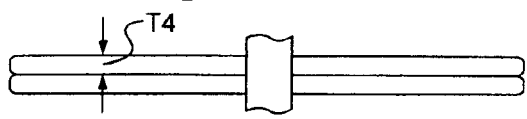
Fig. 14B
Fig. 14
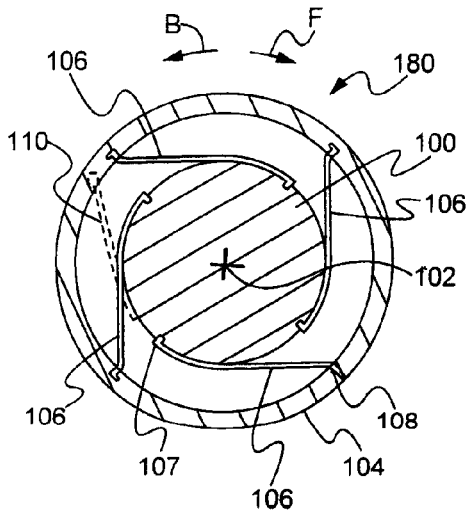
Fig. 15
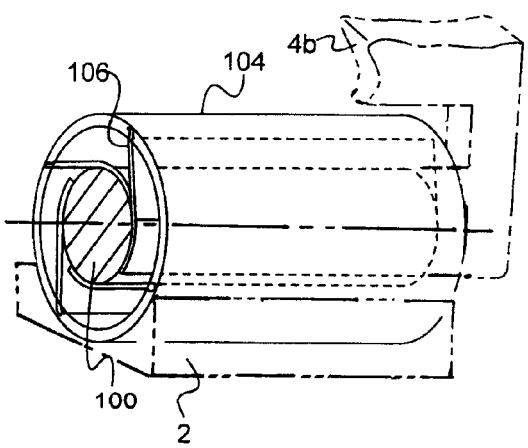
Fig. 15A

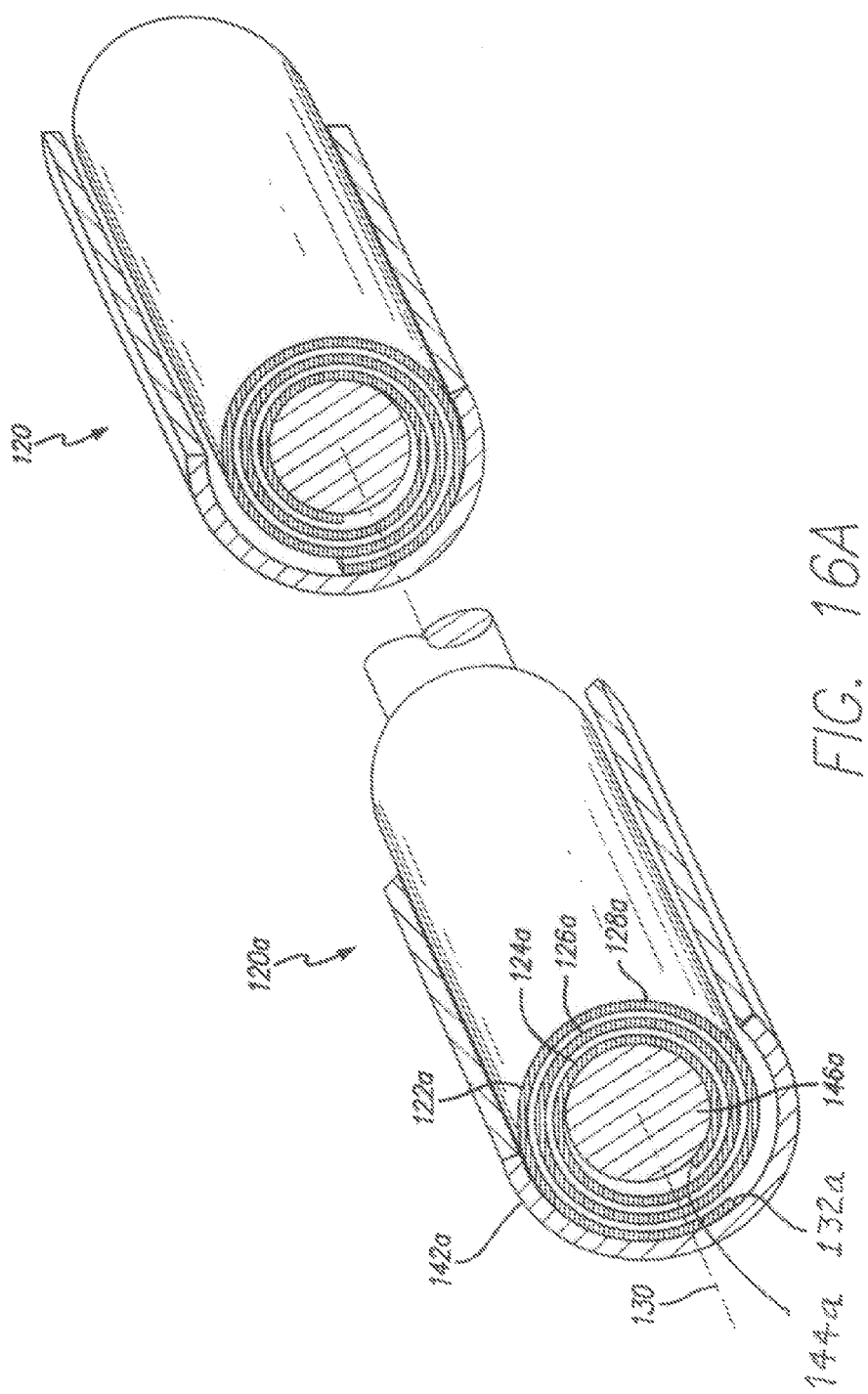

LINEAR DUAL EAP GENERATOR

CROSS-REFERENCE

This application claims priority from U.S. Provisional Patent Application Ser. No. 61/435,560 filed Jan. 24, 2011 the entire content of which is incorporated herein by this reference.

BACKGROUND OF THE INVENTION

The present invention relates to systems for generating electrical power by extracting energy from waves in shallow water that is usually near shore. The system uses panels or floats that are repeatedly pivoted back and forth to stretch and relax sheets of elastomeric material such as SSM (synthetic stretchable material), to thereby vary the voltage between electrodes lying at opposite faces of the sheet.

There have been recent developments of SSM (synthetic stretchable material) in the form of sheets of elastomeric material such as EAP (electro active polymers) which generates electricity when electrodes at opposite faces of the sheet contain opposite electrostatic charges and the distance between the faces changes, as when it is stretched (or possibly compressed). Such synthetic stretchable material is described in U.S. Pat. Nos. 6,768,246 and 7,166,953 by Pelrine; U.S. Pat. No. 6,812,624 by Pei; and U.S. Pat. No. 7,038,357 by Goldenberg; and US publication 2001/0029401 by Ishido. Applicant provides systems for generating electricity from wave energy, using stretching and/or relaxing or compression of SSM.

SUMMARY OF THE INVENTION

In accordance with one embodiment of the present invention, systems are provided for producing electricity from wave, or near-surface current energy, using panels that are pivoted back and forth to stretch and relax sheets of elastomeric material. Each system includes a base anchored to a sea bed, a panel pivotally connected to the base to oscillate back and forth in response to current motion acting on faces of the panel, and power extraction means for extracting energy from movements of the panel. The power extraction means includes at least one capacitor device having opposite ends, with one end connected to the base and an opposite end connected to the panel, to stretch and relax (or compress and decompress) sheets of elastomeric material such as sheets of SSM (synthetic stretchable material). Electrodes lying at opposite faces of the sheet carry electric charges, with the voltage between the electrodes varying as the sheet is stretched and relaxed or compressed and relaxed, and with the varying voltage being used to generate electrical power.

In one system, the base has a base support lying near the sea floor and panels extend upward from the base to the sea surface. In another system, the base has a base support lying above the sea surface and panels hang from the support into the sea. In another system, floating bodies are used instead of panels.

The invention provides a system that facilitates mounting of sheets of elastomeric material. In one approach, the elastomeric sheet is in the form of a rubber band with opposite ends that fit over mounting rods. A pair of such "rubber bands" are mounted so when one is stretched more the other is relaxed (stretched less) and vice versa.

The novel features of the invention are set forth with particularity in the appended claims. The invention will be best understood from the following description when read in conjunction with the accompanying drawings.

BRIEF DESCRIPTION OF THE DRAWINGS

FIG. 1A is an end elevation view of a wave power generating system of the invention wherein opposite ends of a capacitor cylinder move towards and away from each other.

FIG. 1B is a sectional view of a modified wave power generating system of the invention which includes capacitor cylinders beyond both opposite faces of the panel.

FIG. 9 is a front elevation view of a system that includes several sub-systems of the type shown in FIGS. 7 and 8.

FIG. 10 is a sectional view of a wave power generating system of another embodiment of the invention wherein the base is fixed and extends above the sea surface.

FIG. 11 is a sectional view of another system of the invention wherein the base extends above the sea surface.

FIG. 13A is a partial sectional view of a capacitor cylinder such as shown in FIG. 1.

FIG. 13B is a partial sectional view taken on line 13B-13B of FIG. 13A.

FIG. 14 is a partial isometric view of a capacitor cylindrical of another construction that can be used in the cylinder of FIG. 1.

FIG. 14A is a sectional view of the cylinder of FIG. 14A.

FIG. 14B is a view similar to FIG. 14A but with discs of the cylinder compressed more than in FIG. 14A.

FIG. 15 is a sectional view of a capacitor cylinder of another construction that can be used in the cylinder of FIG. 3.

FIG. 15A is a partial sectional view of the cylinder of FIG. 15.

FIG. 16A is a partial isometric view of two capacitor cylinders in which one has its axis turned by 180° and with the shafts of the two devices fixed to each other and such that spiral wrapped sheet are wrapped in opposite directions.

DESCRIPTION OF THE PREFERRED EMBODIMENTS

Figure 2:
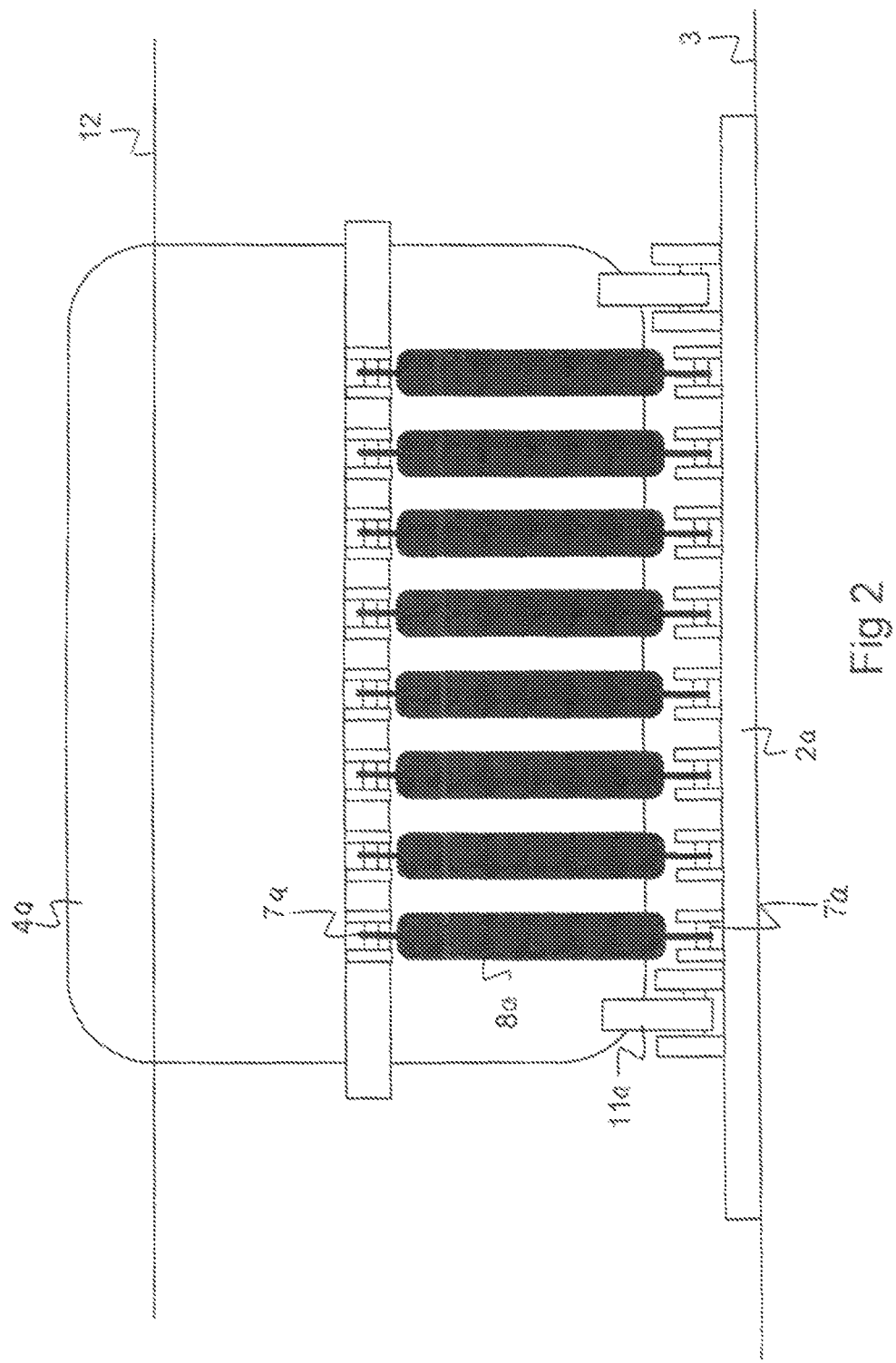
FIG. 2 is a right side elevation view of the system of FIG. 1.

FIG. 1A shows a wave, or water current power generating system 1 of the invention which includes a base 2 lying on the sea floor 3 in a region of shallow waters. The base 2 is pivotally connected at axis 13 to an upstanding panel 4. The panel oscillates backwards and forwards B, F in response to shallow currents acting on panel faces 50, 52. A cylinder 8 lies on a cylinder axis 54 and has opposite ends 7', 7 connected respectively to a support of the base 2 and to the panel 4. Each cylinder end is spaced from the panel pivot axis 13 by at least 5% and preferably at least 10% of the distance between the panel top and bottom ends. The cylinder includes one or more sheets of elastomeric material with electrodes at opposite faces of the sheet. As the panel 4 oscillates under current action, it will either stretch and then relax stretching of the sheet, or compress and relax compression of the sheet. By elongating or compressing the sheet, the cylinder converts energy from shallow current into electricity via a power control unit 9 on the base 2. An electric cable 10 extending from the power control unit 9 delivers electricity to users. The cylinder, or capacitor cylinder holds or is attached to capacitor devices that hold charges under voltages that vary as cylinder locations such as cylinder opposite ends move toward and away from each other or pivot relative to each other.

FIG. 13A shows a portion of a cylinder 60 that can be used as the cylinder 8 of FIG. 1A. The cylinder 60 of FIG. 13A contains power extraction means in the form of variable voltage capacitor devices 62, 64, 66 that are each in the form of a tube. FIG. 13B shows that each capacitor device such as 62 includes a sheet 70 of elastomeric material and a pair of electrodes 72, 74 lying against opposite faces of the sheet. The electrodes are preferably stretchable to follow stretching of the elastomeric sheet 70. FIG. 13B also shows elastomeric protective layers 76 on the electrodes. An elastomeric material can be defined as one with a Young's modules of elasticity of no more than 1.0 GPa, or no more than 50,000 psi.

There are electrical charges of different voltages on the electrodes 72, 74. If the sheet 70 is stretched so its thickness decreases from T1 to T2, then the electrodes move closer together and, for the same electric charge, the voltage between the electrodes decreases. When the stretching is relaxed, so the sheet thickness increases, the voltage increases. It is preferred that the sheet 70 always be pre-stretched somewhat, so relaxation of the sheet results in less stretching. Changes in voltage across the sheet 70 can be used to generate electrical power, as is described in detail in US publication 2010/0314871.

FIG. 14 shows a portion of another cylinder 80 that can be used as the cylinder 8 of FIG. 1A. The cylinder 80 includes a stack of capacitor device 82 that each includes a plate, or sheet, of elastomeric material and a pair of electrodes lying against opposite faces of the sheet. The construction can be as shown in FIG. 13B but without the curvature shown. FIG. 14A shows a pair of capacitor devices 82A, each of a thickness T3, before they are fully compressed. FIG. 14B shows the capacitor devices after they are compressed to the thickness T4. The compression to T4 decreases the voltage between the electrodes lying at opposite faces of each sheet of elastomeric material. Compression of the compressible cylinder 80 of FIG. 14 is obtained by opposite ends 7, 7' (FIG. 1a) of the cylinder being moved toward each other when the panel 4 swings forward F.

FIG. 1B shows another system 1a that is similar to the system of FIG. 1a but that includes a pair of cylinders 8a that each has one end pivotally mounted on a base 2a and an opposite end pivotally connected to the panel 4a. The cylinders 8, which lie on opposite sides of the panel, are preferably pre-stressed in cases where the elastomeric sheet (70, FIG. 13B) of the capacitor device(s) are prestretched and relaxed (to only reduce the stretching). As the panel 4a of FIG. 1B oscillates on opposite side of a vertical line 5, the elastomeric sheet of a cylinder on one side will relax and the sheet of a cylinder on the other side will be stretched even more. The electrical output of each of the cylinders may vary sinusoidally. However, when the voltage outputs of the two cylinders are added the sum voltage varies less because when one voltage output is increasing the other voltage output is decreasing. It is usually easier to utilize a voltage output that varies only moderately, rather than one that varies greatly and at an unpredictable rate. The voltage outputs of the two cylinders vary simultaneously and are 180° out of phase, so their sum varies only moderately and in a repeated and largely predictable manner.

FIG. 2 represents the front view of the wave power generating systems of FIGS. 1A and 1B. The system includes several cylinders 8a spaced apart along the length of the base 2a and along the horizontal length of the panel 4a. Each cylinder 8a is attached at one end 7a to the panel 4 and at the other end 7a' to the base 2a that is fixed on the seabed 3. The panel 4a is pivotally attached to the base 2a via pivot joints 11a. A minority of the panel is above sea level 12.

In shallow waters (under 100 meters depth), water near but below the sea surface moves in ellipses that have a large horizontal component, as indicated at 48 in FIG. 1A. Such wave, or current movement is greatest just below the sea surface and decreases at increasing depth. Such current action is described in PCT WO2004/097212. In order for applicant to obtain maximum panel movement, the panel 4 of FIG. 1A extends to at least the mid tide sea level 84 which is the average sea level. While the bottom 90 of the panel lies near the sea floor, the top 92 of the panel preferably extends slightly above the sea surface 12 level. This allows the panel to be pushed by wave currents 48 lying immediately below the sea surface, even when the panel has tilted from the vertical. This also allows persons on boats to see the tips of the panels to avoid a crash.

Figure 4:
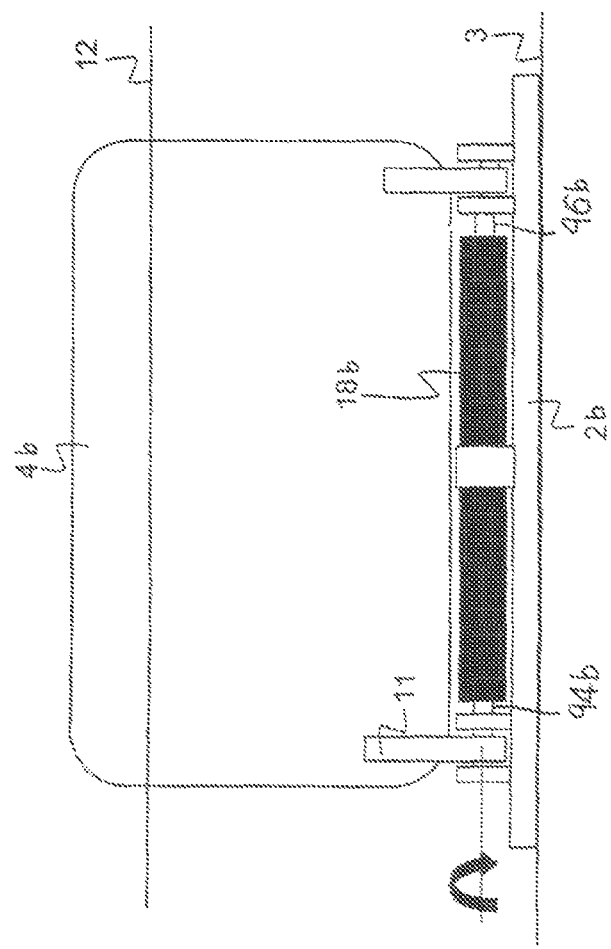
FIG. 4 is a right side view of the system of FIG. 3.
Figure 3:
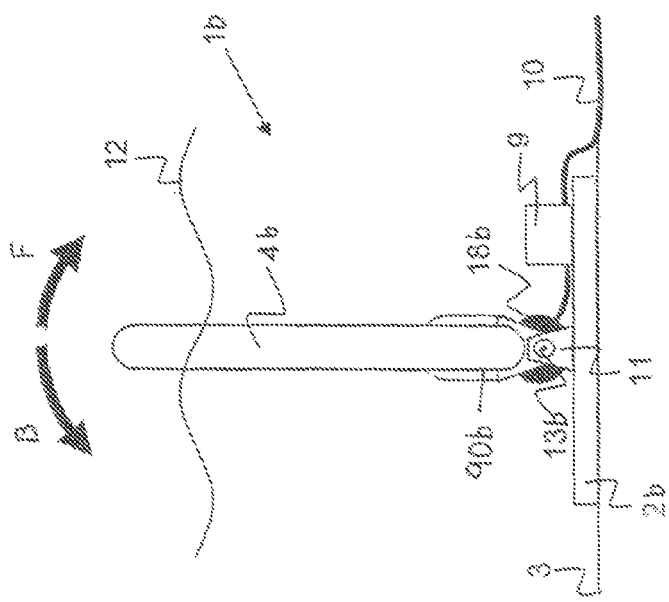
FIG. 3 is an end elevation view of a wave power generating system of another embodiment of the invention, wherein opposite ends of a capacitor cylinder pivot about the cylinder axis relative to each other.
Figure 6:
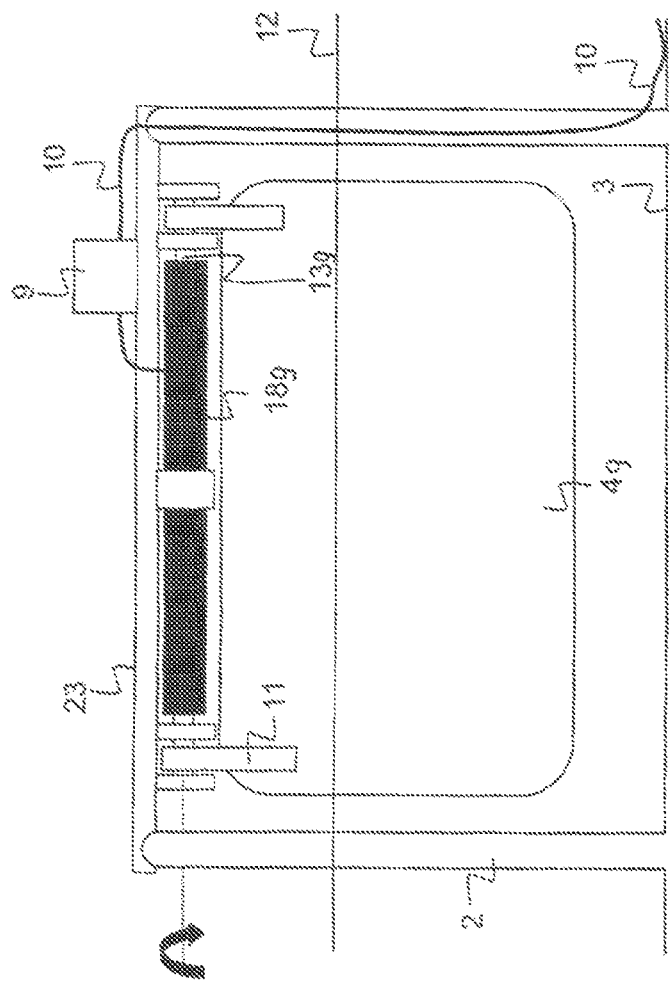
FIG. 6 is a side elevation view of the system of FIG. 5.

FIG. 3 shows a sectional view of another power generating system of the invention. In this embodiment, as in the ones previously shown, the base 2b lies on the sea floor 3. The base is pivotally attached to the bottom 90b of an upstanding panel 4b about a primarily horizontal axis 13b. The panel is able to oscillate, in use, backwards and forwards about axis 13b in response to shallow current motion acting on faces of the panel (as indicated by arrows B, F). In this embodiment, the cylinder 18b has one end 94b (FIG. 4) fixed to the stationary base 2b and an opposite end 96b that is fixed to the pivoting panel 4b.

As the panel 4b oscillates under shallow current action, the panel applies a torsion force to a capacitor device in the cylinder 18b. The increase and decrease of torsion as the panel pivots is used to convert energy from currents into electricity via a power control unit 9 placed on the base 2b and an electric cable 10 that delivers the electricity to users.

FIGS. 15 and 15A show one construction of a cylinder 18c that can be used in place of the cylinder 18b of FIG. 3 to extract electrical energy from rotation of a first end of the cylinder relative to an opposite second end. The cylinder 18c includes a pivoting shaft 100 that lies on the cylinder axis 102 and that is connected to the pivoting panel (4b of FIG. 3), and a stationary tube 104 that is fixed to the base. A plurality of capacitor devices 106 each extends between the pivoting shaft 100 and the tube 104. Each capacitor device 106 includes a sheet of elastomeric material that is stretched when the shaft 100 pivots in direction F while the tube 104 remains fixed to the base and does not pivot. It is possible to mount one or more capacitor devices as shown at 110 to be stretched when the panel and shaft 100 pivot in direction B, and to prestretch all capacitor devices. By the use of capacitor devices such as 106, 110 that extend in opposite directions, the devices can be mounted in prestretched positions.

Figure 16:
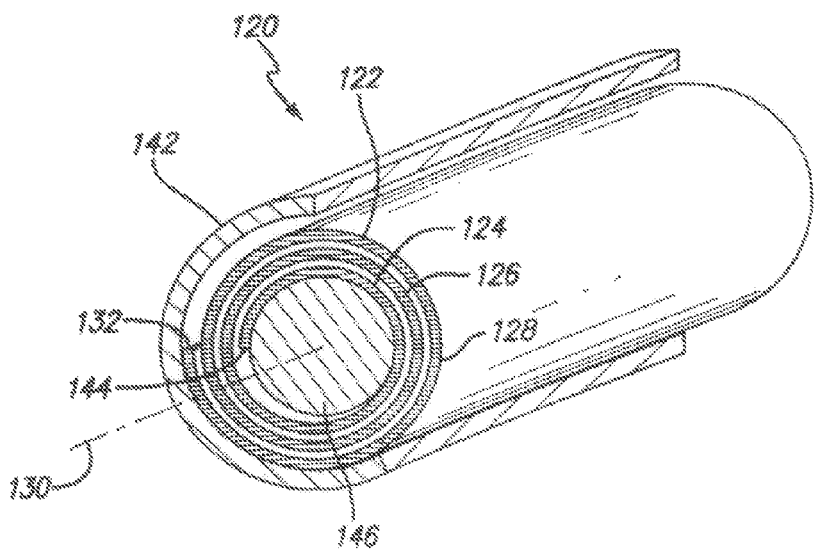
FIG. 16 is a partial isometric view of a capacitor cylinder of another construction that can be used in the cylinder of FIG. 3.

FIG. 16 shows another construction of a cylinder, the cylinder being constructed as capacitor device 120 that can be used in place of the cylinder 18b of FIG. 3 to extract electrical energy from relative rotation of opposite ends of the cylinder. The capacitor device 120 includes a multi-layer sheet 122 of elastomeric material (also called the wrap) that is wrapped in at least one turn, and preferably a plurality of turns 124, 126, 128 in a spiral about an axis 130. The radially outer edge 132 of the multi-layer sheet 122 is fixed to a tube 142 that is fixed to the fixed end of the cylinder. The radially inner edge 144 of the wrap 122 is fixed to a shaft 146 that pivots as a panel pivots. It is possible to provide two capacitor devices that are each of the construction of FIG. 16, but with one having its axis 130 turned by 180°, and with the shafts of the two devices fixed to each other. In that case, each sheet 122 can be maintained in a particularly stretched state. That is shown in FIG. 16A in which the second capacitor device 120a includes a multilayer sheet 122a of elastomeric material (also called the wrap) that is wrapped in at least one turn, and preferably a plurality of turns 124a, 125a, 128a in a spiral about the axis 130 wherein the direction of the spiral is opposite that of the spiral of the multi-layer sheet 122 of the capacitor device 120. The radially outer edge 132a of the multilayer sheet 122a is fixed to a tube 142a that is fixed to the fixed end of the cylinder. The radially inner edge 144a of the wrap 122a is fixed to a shaft 146a that pivots as a panel pivots. Whereby the capacitor devices 120 and 120a operate together but in opposite rotation, that is one wraps tighter to increase stretching of the multilayer sheet while the other unwraps to reduce stretching of the multilayer sheet.

Figure 17:
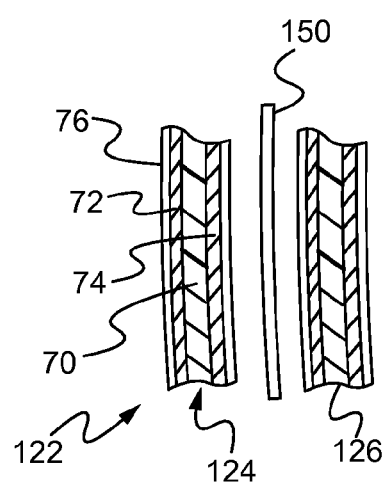
FIG. 17 is a sectional view of a portion of the capacitor cylinder of FIG. 16.

FIG. 17 shows that the multi-layer sheet 122 has the construction of the capacitor device of FIG. 13B, including an elastomeric sheet 70, electrodes 72, 74, and elastomeric protective layers 76. A sheet 150 of low friction material (e.g. Teflon) lies between adjacent turns such as 124, 126. It is possible to also provide a capacitor device similar to 120 (FIG. 16) but with the sheet wound in an opposite direction to sheet 120. As a result one sheet undergoes increased stretching while the other sheet undergoes decreased stretching. This is described above with respect to FIG. 16A.

Figure 5:
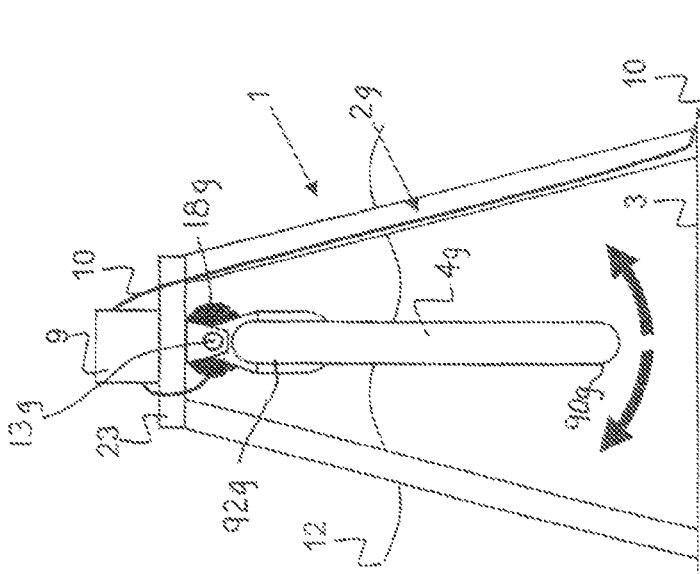
FIG. 5 is an end elevation view of another wave power generating system of the invention wherein an upper end of a panel is pivotally mounted on an above-sea base support and extends downward therefrom.

FIG. 5 shows another shallow current power generating system in which the pivoting panel 4g hangs from a support 23 of a base 2g. The upper end 92g of the panel 4g preferably lies above the sea surface. A majority of the panel height lying between the panel ends 90g, 92g, lies under the sea surface 12. A cylinder 18g that extracts electrical energy from panel pivoting, has one cylinder end fixed to the support 23 and an opposite cylinder end fixed to the panel, with both ends lying on the cylinder axis 13g.

Figure 7:
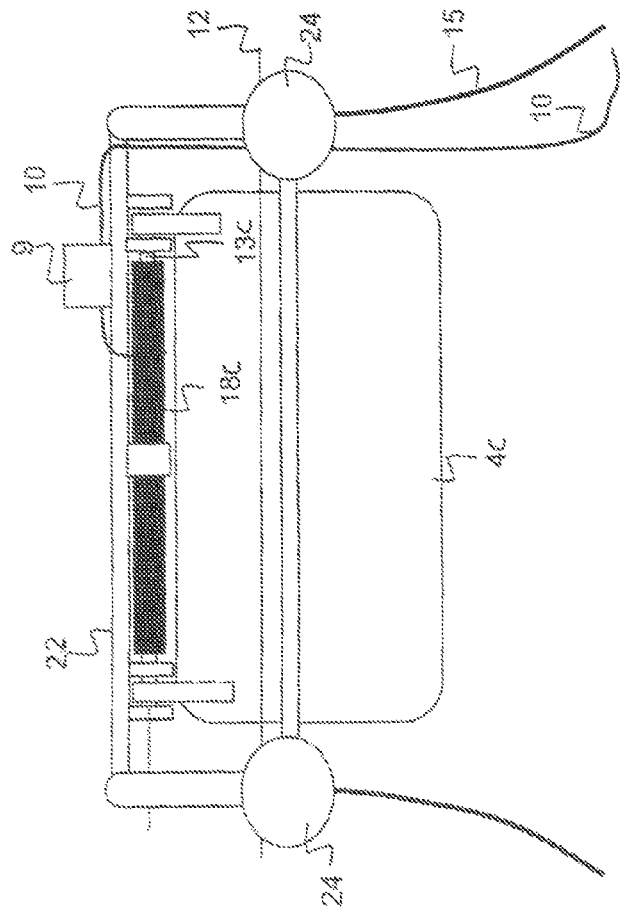
FIG. 7 is an end elevation view of a wave power generating system of another embodiment of the invention wherein the base floats and is anchored to the sea floor by mooring lines, and the panel hangs from the base.
Figure 8:
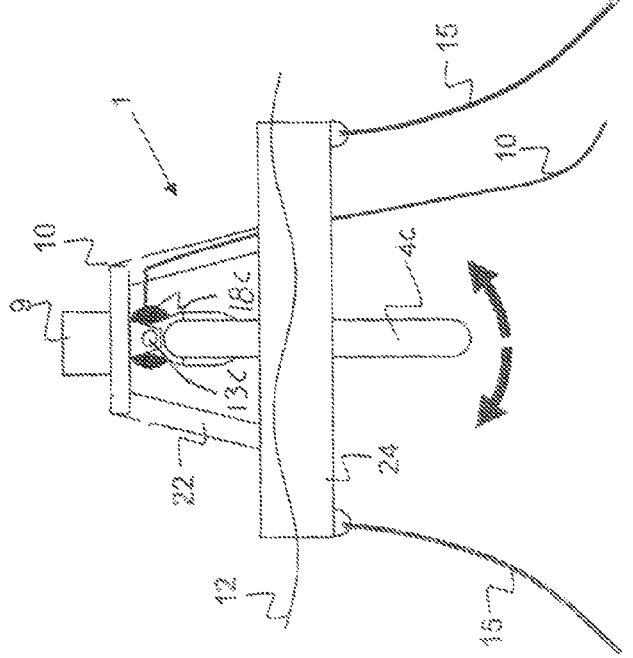
FIG. 8 is a side elevation view of the system of FIG. 7.

FIG. 7 shows another power generating system of the invention wherein the base 24 is buoyant and is anchored to the sea floor by mooring lines 15 that limit drift of the base from an initial location. The figures show catenary lines, but other line shapes or even rigid posts can be used. The base has a support 22 that supports the top end of a panel 4c about a primarily horizontal axis 13c so the panel hangs therefrom with most of the panel lying under water level to be exposed to wave action. A cylinder 18c for converting motion to electricity, has an axis 13c lying on the cylinder axis and may be of the types described above for the cylinder of FIG. 3. FIGS. 8 and 9 show that the system generally includes a plurality of panels and corresponding cylinders.

FIG. 10 shows a system wherein the base 122 is fixed to the sea bed 3 and has a base portion 25 lying above the sea surface 12. A panel 4d hangs from the base and has an upper end 123 lying above the sea surface and a lower end 125 lying at least one meter below the sea surface. A cylinder 8d has opposite ends 7d, 7'd with one end 7'd connected to the base at a location spaced from the panel axis 13d, and has an opposite end 7d connected to the panel at a location spaced from the panel axis 13d. FIG. 11 shows a system similar to FIG. 10, except that the cylinder 18e has one end fixed to the base and an opposite end connected to the panel, with one cylinder end pivotable about the axis 13e of the panel 4e.

Figure 12:
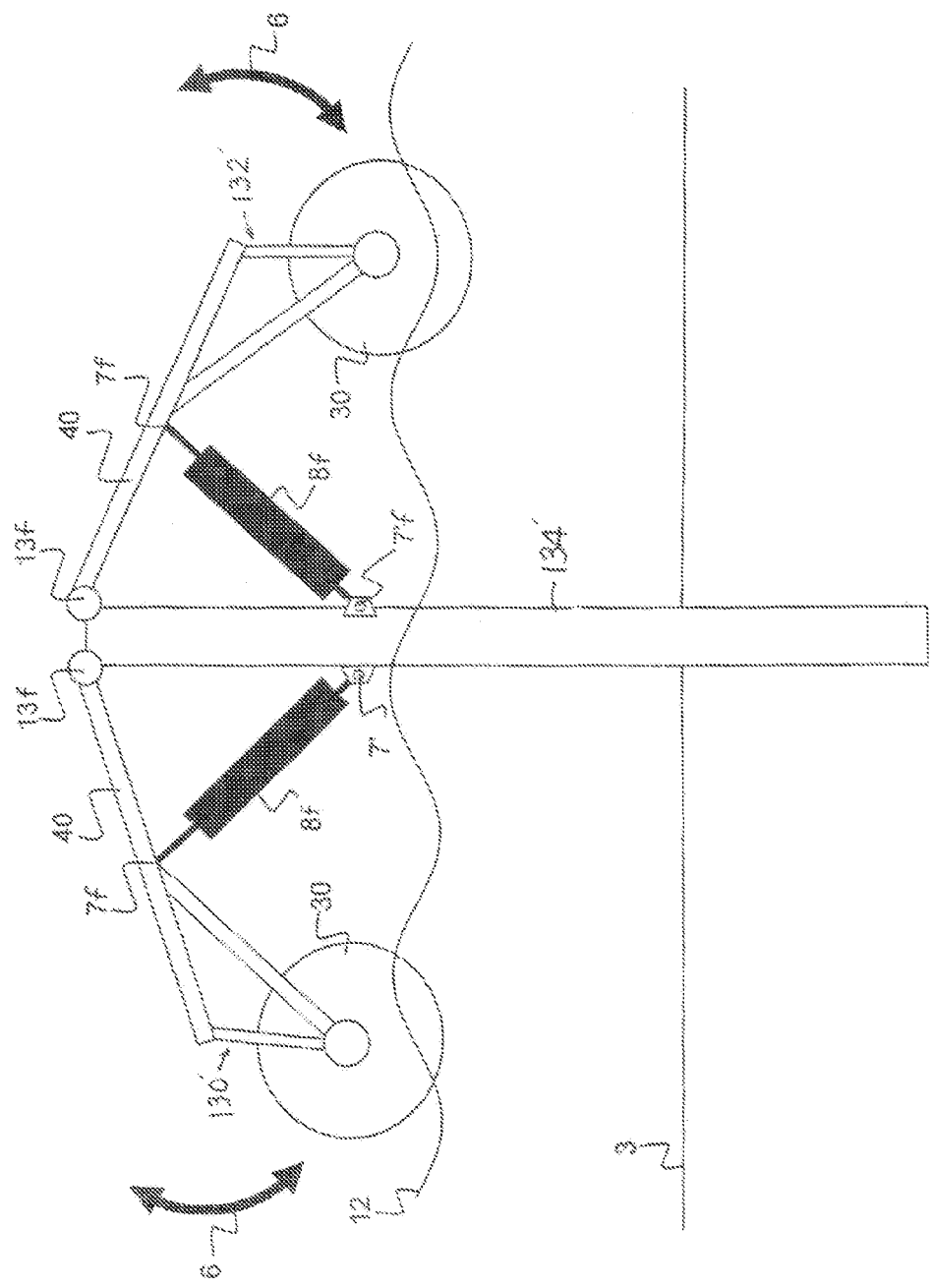
FIG. 12 is a front view of a wave generating system of another embodiment of the invention that includes buoys that float on the sea surface.

FIG. 12 is a front view of a power generating system of another embodiment of the invention wherein two buoyancy modules 130, 132 at the sea surface are connected to a base 134' that is anchored to the sea to limit drift to zero drift. Each buoyancy module includes a buoyant body 30 that floats on the sea surface 12 and a pivoting frame 40. The frames oscillate up and down about corresponding primarily horizontal axes 13f. Cylinders 8f extend between the pivoting frames 40 and the base 134'. The cylinders 18f can be of the types shown in FIG. 13A or 14 wherein opposite ends 7f, 7'f of each cylinder move toward and away from each other. As an alternative, cylinders can be used that each lies on a pivot axis and is of the type shown in FIG. 15.

Figure 18:
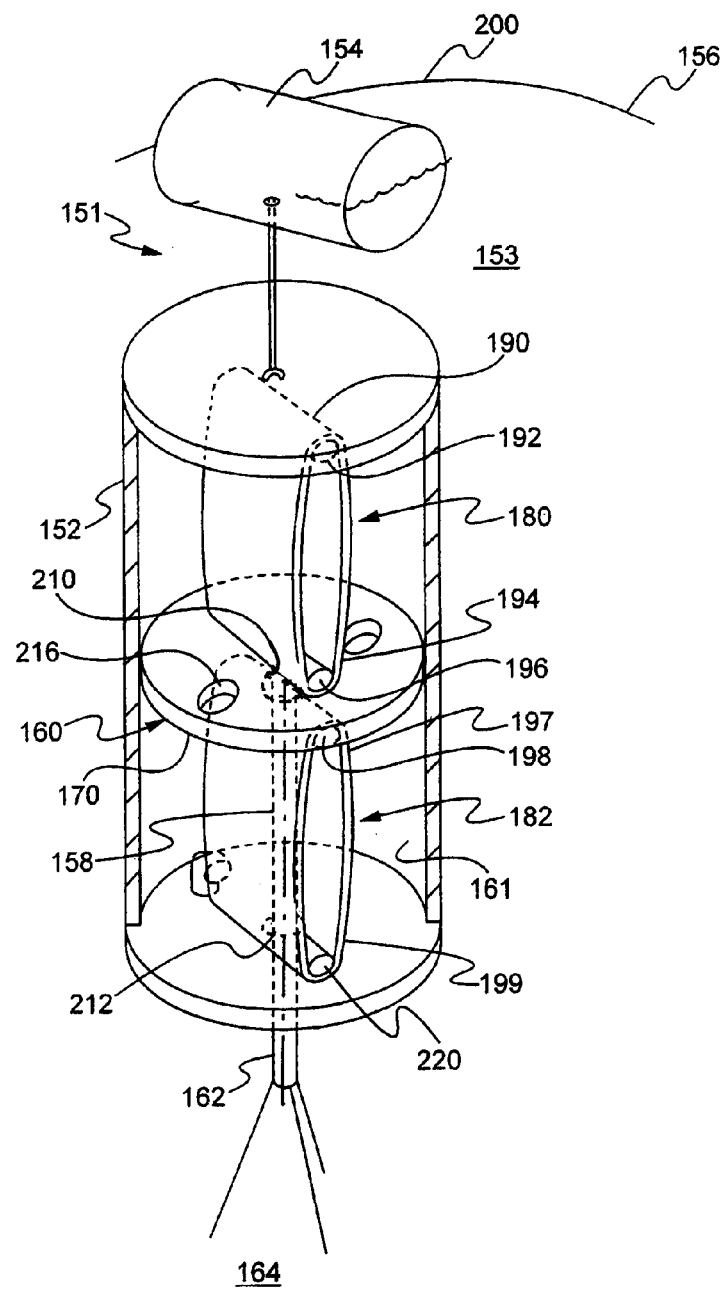
FIG. 18 is a sectional view of another embodiment of the invention wherein a pair of capacitor devices counter each other and are more easily mounted.

One problem encountered in the use of a capacitor device formed by a sheet of elastomeric material with electrodes at its opposite faces, is mounting the device in a manner that avoids concentrated forces that can tear the sheet. FIG. 18 shows a system 151 in which a cylinder element or cylinder 152 lies in the sea 153, with the cylinder attached to a float 154 that floats (moves up and down) on the waves 156. A piston element or piston 160 that can slide largely vertically relative to a chamber 161 formed in the cylinder, has a piston rod 158 with a lower end 162 anchored to the sea floor 164 to avoid vertical motion of the piston. The piston has an upper end, or piston head 170 lying in the cylinder, with the piston rod 158 extending downward along an axis from the piston head 170.

Figure 20:
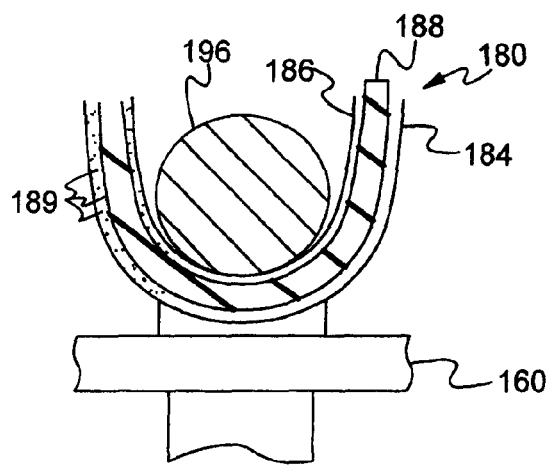
FIG. 20 is a sectional view of a portion of the system of FIG. 18.

A pair of capacitor devices 180 (first capacitor device), 182 (second capacitor device) lie in the cylinder 152. Each capacitor device is formed by a preferably endless band 188 (FIG. 20) of elastomeric material, with electrodes 184, 186 at opposite faces of each band. FIG. 20 shows an elastomeric sheet 188 and particles 189 of conductive material embedded in opposite face regions of the sheet. The upper (first capacitor device) capacitor device 180 (FIG. 18) has an upper loop, or half-loop, or top or upper end 190 extending around one mounting rod 192 that is fixed to the cylinder, and has its lower loop or lower or bottom end 194 extending around another mounting rod 196 that is fixed to the piston head 160. The lower capacitor device 182 has its upper loop or end 197 extending around a mounting rod 198 that is fixed to the piston head 170. The lower capacitor device 182 has its lower loop or bottom end 199 extending around a rod 220 mounted on the bottom of the cylinder. Both band-shaped capacitor devices 180, 182 are under tension.

Figure 19:
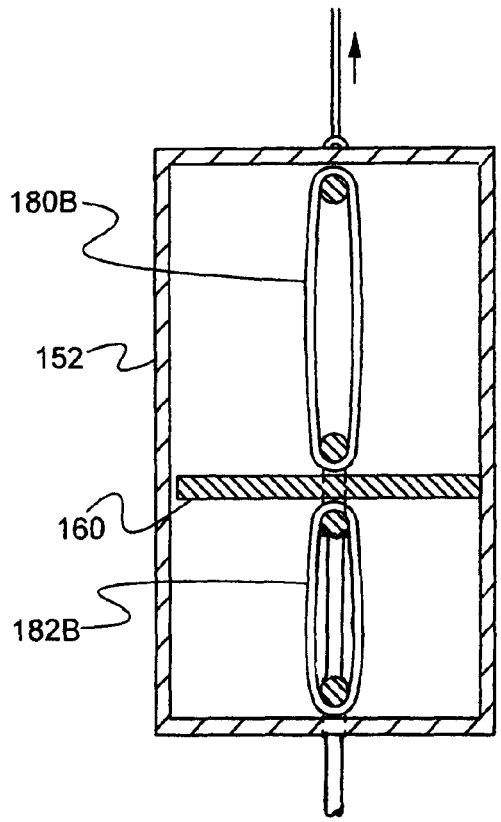
FIG. 19 is a partial sectional view of the system of FIG. 18, with the cylinder having moved up.

When the float 154 rises on the crest 200 of a wave, the cylinder 152 moves upward but the piston 160 does not move up, thereby stretching the upper band-shaped capacitor device as shown at 180B in FIG. 19. At the same time, the bottom of the lower band-shaped capacitor device 182 moves up, resulting in relaxation of the lower capacitor device as shown at 182B in FIG. 19.

The ends of the capacitor devices are connected to the piston and to the cylinder by means that increases stretching of one device and simultaneously decreases stretching (relaxing) of the other device when the cylinder moves relative to the piston. This is done in FIG. 18 by mounting rods 192, 196, 198, 220 that hold an end of the capacitor device to an appropriate location on the cylinder and piston.

Each band-shaped capacitor device 180, 182 can be mounted in place by inserting a different mounting rod such as 192, 196, 198, 220 though each end of the band. The stress on the end of the band-shaped device depends upon the radius of curvature of the mounting rod and other factors. The piston can be moved up or down to reduce the distance between the mounting rods during initial mounting of the band devices.

FIG. 18 shows that there are holes 210, 212 in only the lower band device 182, with the piston rod 158 extending though the holes. The piston head 170 has apertures 216 to allow fluid to pass between the top and bottom of the cylinder. The cylinder preferably contains a pressured, nonconductive fluid such as dry air or oil.

The system 151 of FIG. 18 enables electrical power to be obtained more directly than in other systems, from linear motion in opposite directions. The system can simplify the conversion of linear motion (e.g. a float moving largely vertically in the waves) into electrical power, using relatively few components and few steps, to thereby increase conversion efficiency. When one capacitor device such as 182B in FIG. 19 is relaxing, the voltage between its electrodes 184, 186 is increasing, and this higher voltage can do work as well as charge the electrodes of the other capacitor device 180B. At the same time, the voltage across the electrodes of the capacitor device 180B is decreasing.

The system 151 can be used not only to generate electricity using linearly-moving parts, but can be used to move the piston relative to the cylinder. This can be useful during installation of a band-shaped capacitor device. The system can be used with the piston 160 uppermost and connected to the float 154, and with cylinder 152 fixed to the sea floor, and the two arrangements are the equivalent of each other. The piston and/or cylinder elements can move in any direction, in addition to vertical, and can have any shape or relationship as long as one moves relative to the other. The system 151 can be used in place of the cylinders 8f of FIG. 12.

Figures 21, 22:
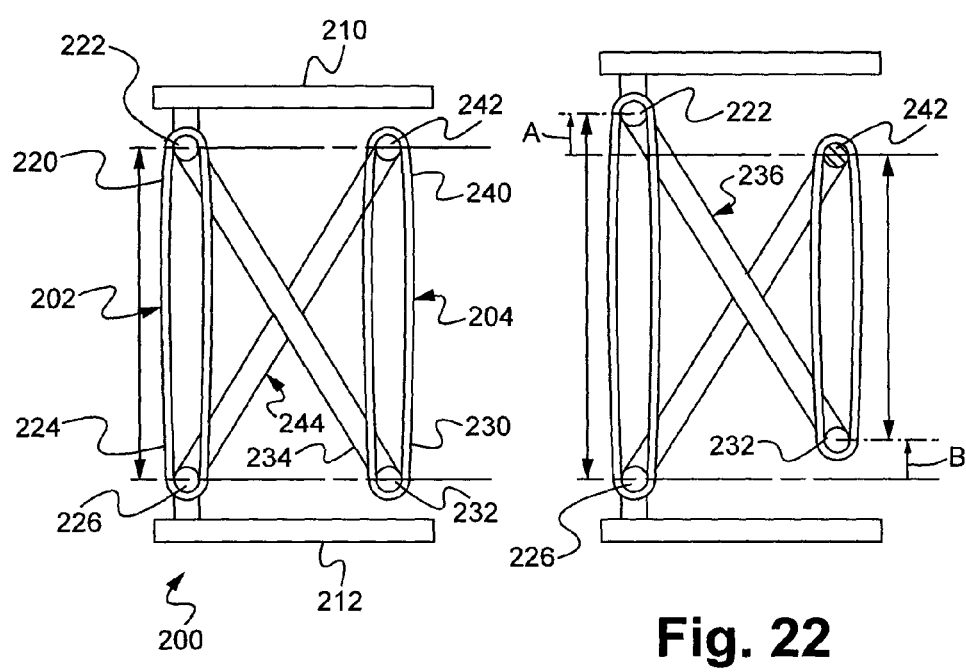
FIG. 21 is a view of another system with means for increasing stretching of one capacitor device while relaxing stretching of another capacitor device.
FIG. 22 is a view of the system after the first device rod has moved upward by distance A.

FIG. 21 shows another system 200 with means for increasing stretching of one capacitor device 202 while relaxing stretching of another capacitor device 204. This occurs when an upper part 210 such as a cylinder moves up while a lower part 212 such as a piston does not move relative to the first part. The first capacitor device 202 has an upper end or loop 220 held by a rod 222 that is mounted on the cylinder 210 and a lower end or loop 224 mounted on a rod 226 that is fixed to the piston 212. The second capacitor device 204 has a lower end 230 held by a rod 232 that is held by the end 234 of a first beam 236. Similarly, the second device upper end 240 is held by a rod 242 that lies at the end of a second beam 244.

FIG. 22 shows the system after the first device rod 222 has moved upward by distance A. The beam 236 has moved the second device rod 232 upward by the same distance B. The rods 226, 242 have not moved. As a result, the first capacitor device has been stretched by distance A while the second capacitor device has been relaxed (decreased in stretching) by distance B.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. Apparatus for generating electricity from motion of a sea, by converting repetitive motion of a first part relative to a second part into electrical energy, comprising:
   first and second capacitor devices that each comprises a stretched sheet of elastomeric material with opposite ends, and electrodes at opposite faces of the sheet, with the electrodes carrying a voltage between them that varies as the devise is stretched and relaxed;
   means for connecting said ends of said capacitor devices to said first and second part in an arrangement wherein when one of said parts moves relative to the other part, one of said capacitor devices undergoes increased stretching and the other of said capacitor devices undergoes a reduction of stretching.

2. The apparatus described in claim 1, wherein:
   of said first and second parts, one is a cylinder with a cylinder chamber and the other is a piston with a piston head that is moveable in the cylinder chamber;
   one of said parts is fixed to the sea floor to prevent its vertical movement, and the other of said parts is connected to a float that moves up and down in the waves.

3. The apparatus described in claim 1 wherein:
   said first part comprises a cylinder and said second part comprises a piston with a piston head that is moveable with a vertical directional component relative to said cylinder;
   said means for connecting includes a first mount that attaches an upper end of said first capacitor device to said cylinder and a second mount that attaches a lower end of said first capacitor device to a piston head location that always lies below said first mount;
   said means for connecting also includes a third mount that attaches an upper end of said second capacitor device to a third location on said piston, and a fourth mount that attaches a lower end of said second capacitor device to a fourth location on said cylinder that always lies below said third location.

4. The apparatus described in claim 1 wherein:
   each of said first and second capacitive devices includes an endless band arrangement that includes and endless band of elastomeric material having opposite faces and a pair of electrodes each lying at one of said opposite faces, said band having opposite loops and including a plurality of rods that each mounts in one of said loops of the bands with the rod attached to one of said first and second parts by the rod extending through a loop in the band arrangement and the rod being mounted on the said corresponding first or second part.

5. The apparatus described in claim 1 wherein:
   said first part comprises a cylinder and said second part comprises a piston;
   a quantity of dielectric fluid lying in said cylinder;
   said piston has a piston head that lies in said cylinder and is moveable therein, and including a quantity of dielectric fluid lying in said cylinder;

said piston head has at least one perforation that allows said dielectric fluid to move therethrough between spaces below and above said piston head.

6. The apparatus described in claim 1 wherein:

said stretched sheet of elastomeric material of each of the first and second capacitor devices having electrodes at opposite faces of the sheet comprises a rolled-up sheet and further comprising an elastomeric protective layer lying against electrodes at least one face of said sheet.

7. The apparatus described in claim 1 wherein:

said means for connecting includes first and second torsion parts that are pivotable back and forth relative to one another about an axis, with one of said torsion parts applying torsion to force its rotation, and said sheet of said first capacitor device extends between locations on said first and second torsion parts that are selected to be stretched and unstretched as said first locations pivot back and forth relative to each other and said sheet of said second capacitor device extends between locations on the first and second torsion parts that are selected to be respectively unstretched and stretched.

8. Apparatus for converting repetitive motion in at least a partially vertical direction, of a cylinder element relative to a piston element, into electrical energy, comprising:

top and bottom capacitor devices said top capacitor device having a top end connected to a top end of said cylinder element and said top capacitor device having a bottom end connected to a location on said piston element, that lies below said top end of said cylinder element;

said bottom capacitor device having a top end connected to a location on said piston element and said bottom capacitor device having a bottom end connected to a lower location on said cylinder element that lies below said upper location on said piston element, so when the cylinder element moves up relative to the piston element the top capacitor device experiences an increased tension between its ends while the bottom capacitor device experiences a reduced tension between its ends.

9. The apparatus described in claim 8 wherein:

each of said top and bottom capacitor devices includes an endless band arrangement that includes a band of elastomeric material having opposite faces and a pair of electrodes each lying at one of said opposite faces, and including a plurality of rods that each mounts an end of one of said endless bands to a corresponding one of said elements by the rod extending through the band and the rod being mounted on the corresponding element.

10. Apparatus for converting repetitive motion of a first part relative to a second part, into electrical energy, including a first capacitor device which includes a sheet of elastomeric material having opposite faces and a pair of electrodes at said opposite faces, said first capacitor device having opposite ends mounted respectively on said first and second parts, wherein:

said sheet of elastomeric material is in the shape of an endless band with opposite loops forming said opposite ends as band ends, and including a pair of mounting rods with one rod extending through one of said band ends and mounted on said first part and with the other rod extending through the other of said band ends and the mounted on said second part.

11. The apparatus described in claim 10 wherein:

said apparatus includes a second capacitor device of the same construction as said first capacitor device, said second capacitor device having opposite loops forming band ends mounted respectively on said second and first parts so when said first capacitor device elongates to undergo increased stretching, said second capacitor device undergoes decreased stretching.

12. The apparatus described in claim 8 wherein:

said first part is a cylinder and said second part is a piston element said piston element has a piston head that lies in said cylinder and that divides a space in said cylinder into top and bottom cylinder spaces, with said piston head moveable at least partially vertical relative to said cylinder;

said top capacitor device lies completely in said top cylinder space and having said bottom end connected to said piston head while said bottom capacitor device lies completely in said bottom cylinder space and having said top end connected to said piston head.

13. Apparatus for generating electricity from motion of a sea, by converting repetitive motion of a first sea-controlled part relative to a second sea-controlled part, into electrical energy, comprising:

a first capacitor assembly that comprises a stretched sheet of elastomeric material with opposite ends and with electrodes at opposite faces of the sheet, with the electrodes carrying a voltage between them that varies as the capacitor assembly is stretched and relaxed;

said first capacitor assembly includes a pair of devices wherein a first of said devices applies torsion about an axis to said sheet of elastomeric material and including a second device that holds a second end of said sheet to prevent rotation of said second end of said sheet about said axis relative to said first sea-controlled part a second capacitor apparatus of the same construction as said first capacitor assembly but turned 180° about said axis and connected to increase stretching of the sheet of said second capacitor apparatus when the sheet of said first capacitor apparatus undergoes decreased stretching and to decrease stretching of the sheet of said second capacitor apparatus when the sheet of said first capacitor undergoes increased stretching.

\* \* \* \* \*